United States Patent
Yang

(10) Patent No.: US 8,780,661 B2
(45) Date of Patent: Jul. 15, 2014

(54) SELF REFRESH PULSE GENERATION CIRCUIT

(75) Inventor: Jong Yeol Yang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 278 days.

(21) Appl. No.: 13/337,471

(22) Filed: Dec. 27, 2011

(65) Prior Publication Data

US 2013/0114348 A1  May 9, 2013

(30) Foreign Application Priority Data

Nov. 4, 2011 (KR) .................. 10-2011-0114797

(51) Int. Cl.
*G11C 7/00* (2006.01)
*G11C 11/406* (2006.01)

(52) U.S. Cl.
CPC .................... *G11C 11/406* (2013.01)
USPC ................... 365/222; 365/230.06

(58) Field of Classification Search
CPC .................................................. G11C 11/406

USPC ............................................. 365/222, 230.06
See application file for complete search history.

(56) References Cited

U.S. PATENT DOCUMENTS

| | | | | |
|---|---|---|---|---|
| 6,327,208 B1 * | 12/2001 | Kitade | ........................... | 365/222 |
| 6,912,169 B2 * | 6/2005 | Choi | ............................. | 365/222 |
| 2007/0070767 A1 * | 3/2007 | Im et al. | ........................ | 365/222 |
| 2009/0180344 A1 * | 7/2009 | Lee | ................................ | 365/222 |

FOREIGN PATENT DOCUMENTS

KR      1020050104253 A      11/2005

* cited by examiner

*Primary Examiner* — Vu Le
(74) *Attorney, Agent, or Firm* — William Park & Associates Patent Ltd.

(57) ABSTRACT

A self refresh pulse generation circuit includes a control signal generator configured to generate a control signal asserted for an initial period of a self refresh mode, and a self refresh pulse generator configured to generate a self refresh pulse having a period controlled in response to the control signal, in the self refresh mode.

20 Claims, 5 Drawing Sheets

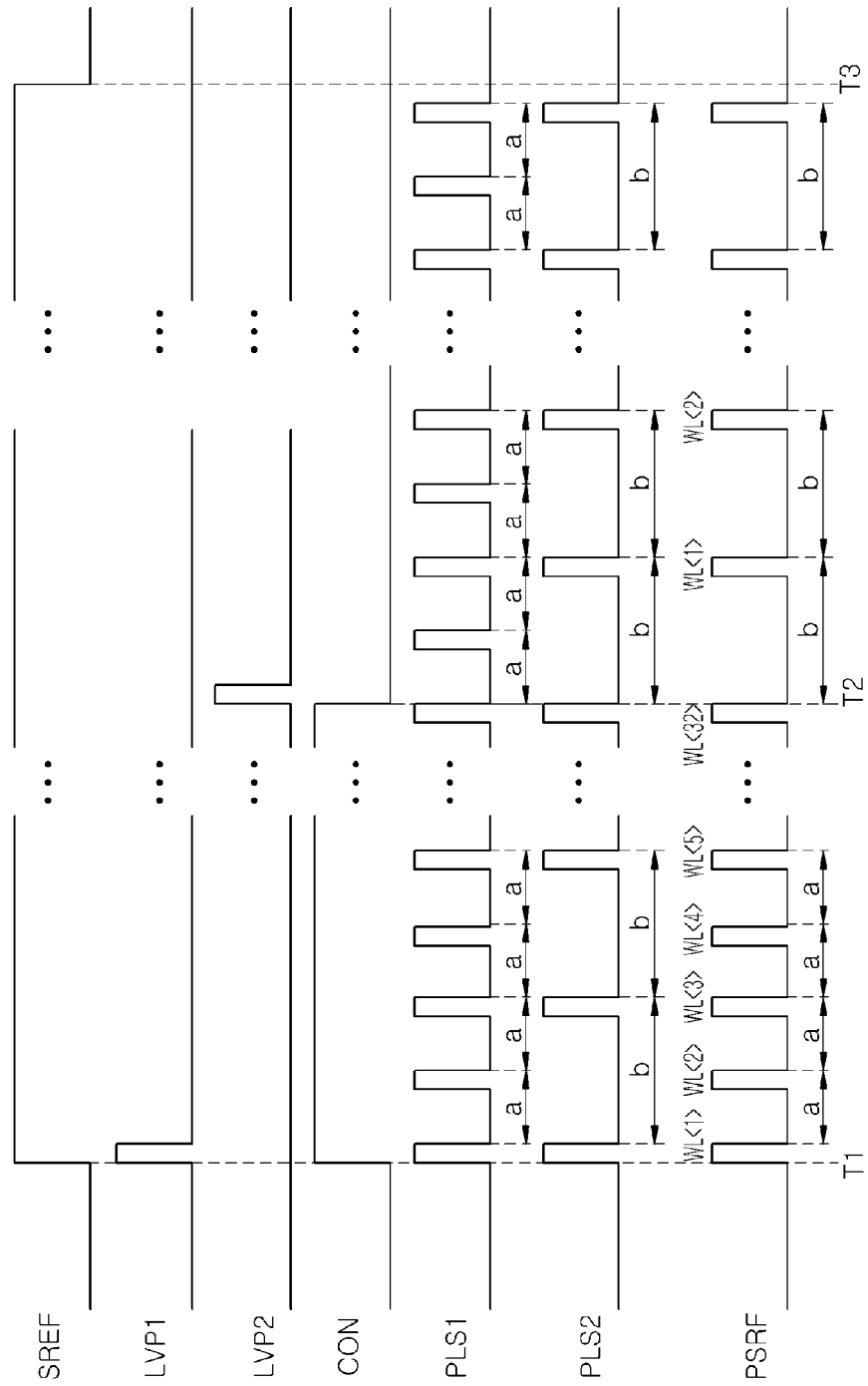

SELF REFRESH PULSE GENERATION CIRCUIT

CROSS-REFERENCES TO RELATED APPLICATIONS

The present application claims priority under 35 U.S.C 119(a) to Korean Application No. 10-2011-0114797 filed on Nov. 4, 2011 in the Korean intellectual property Office, which is incorporated by reference in its entirety.

BACKGROUND

A DRAM (Dynamic Random Access Memory) may lose data stored in memory cells as the time passes, unlike a SRAM (Static Random Access Memory) or flash memory. In order to prevent such a phenomenon, an operation of restoring data stored in memory cells at each predetermined period is required. Such an operation is referred to as refresh. The refresh is performed by activating word lines at least one time within a retention time of cells in a bank and sensing and amplifying data stored in the cells. The retention time refers to a time during which data stored in a cell may be maintained without refresh.

FIG. 1 is a diagram showing interference which occurs between word lines when the word lines are activated.

Referring to FIG. 1, a second word line WL<2> neighbors first and third word lines WL<1> and W<3>. In general, when word lines are activated, a high voltage VPP is applied to the word lines such that electromagnetic interference occurs between the word lines. When the first and third word lines WL<1> and W<3> are activated, a small amount of voltage is generated in the second word line WL<2> in response to electromagnetic interference between the first and third word lines WL<1> and W<3>. Therefore, a leakage current is generated through cell transistors that couple the second word line WL<2> to cells, respectively. The retention time of each cell is reduced by this leakage current.

Accordingly, when entering a refresh mode immediately after the first and third word lines WL<1> and W<3> adjacent to the second word line WL<2> are activated, a refresh fail may occur because the retention time of the cells coupled to the second word line WL<2> was reduced. That is, referring to FIG. 2, when a refresh pulse PSRF having a preset period $t_0$ is outputted to perform a refresh operation from a time point T1 to a time point T2, the refresh pulse RSRF is generated after the retention time of the cells coupled to the second word line WL<2> passes. Therefore, a refresh fail occurs.

SUMMARY

An embodiment of the present invention relates to a self refresh pulse generation circuit capable of preventing a refresh fail by generating a self refresh pulse having a period controlled at an initial period after entering a self refresh mode.

In one embodiment, a self refresh pulse generation circuit includes a control signal generator configured to generate a control signal asserted for an initial period of a self refresh mode, and a self refresh pulse generator configured to generate a self refresh pulse having a period controlled in response to the control signal, in the self refresh mode.

In another embodiment, a self refresh pulse generation circuit includes a pulse generation unit configured to generate first and second pulses in response to a self refresh signal, and a self refresh pulse output unit is configured to selectively output the first or second pulse as a self refresh pulse in response to a control signal asserted for an initial period of a self refresh mode.

In another embodiment, a method of refreshing memory includes selectively outputting a series of first pulses with a first period as a self refresh pulse signal for an initial period of a refresh cycle, and selectively outputting a series of second pulses with a second period as the self refresh pulse signal for a remainder of the refresh cycle after the initial period, wherein the initial period is the amount of time to count all row addresses by a counter that is clocked by the self refresh pulse signal.

BRIEF DESCRIPTION OF THE DRAWINGS

The above and other aspects, features, and advantages will be more clearly understood from the following detailed description taken in conjunction with the accompanying drawings:

FIG. 7 is a timing diagram explaining an operation of the self refresh pulse generation circuit in accordance with an embodiment of the present invention.

DESCRIPTION OF SPECIFIC EMBODIMENTS

Embodiments of the present invention will be described with reference to accompanying drawings. However, the embodiments are for illustrative purposes only and are not intended to limit the scope of the invention.

Figure 1:
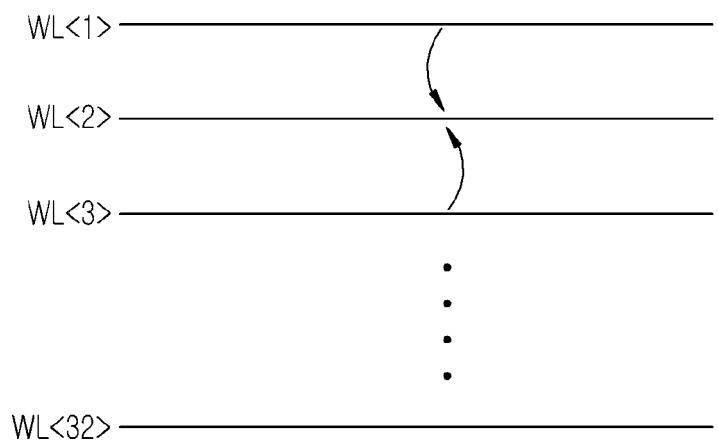
FIG. 1 is a diagram showing interference that occurs between word lines when word lines are activated.
Figure 2:
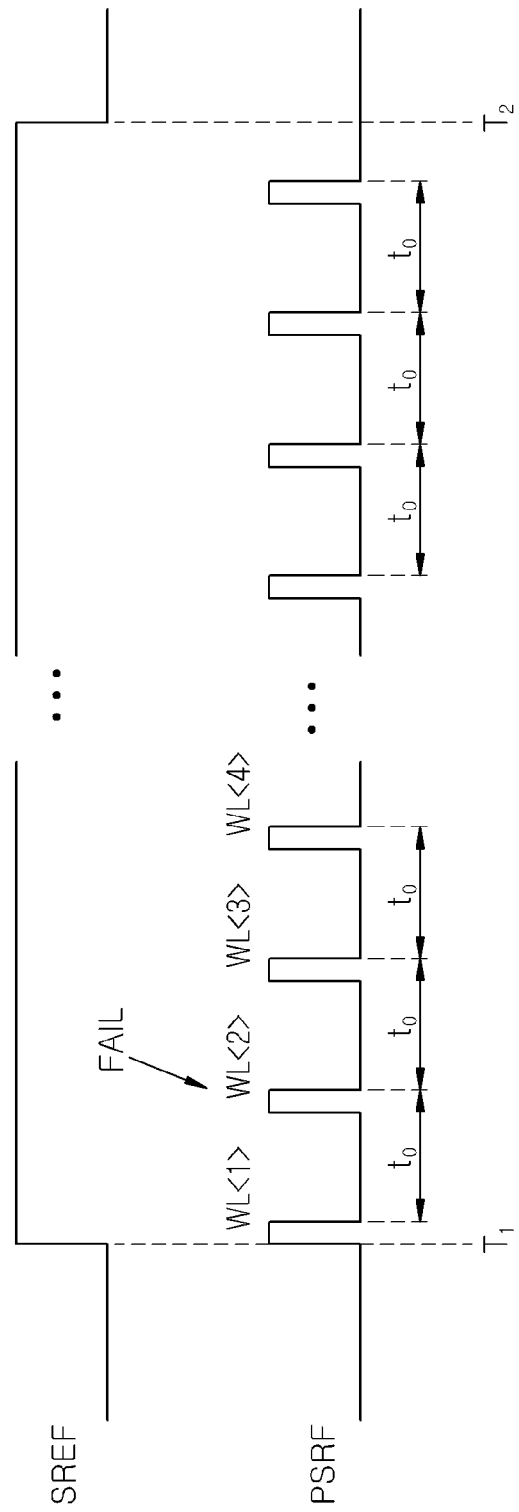
FIG. 2 is a timing diagram explaining an operation of a conventional refresh pulse generation circuit.
Figure 3:
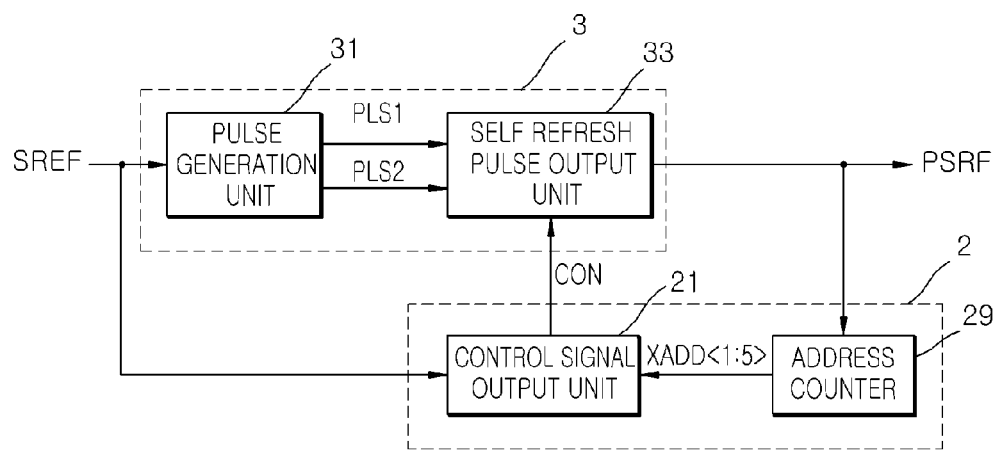
FIG. 3 is a block diagram illustrating an exemplary self refresh pulse generation circuit in accordance with an embodiment of the present invention.

FIG. 3 is a block diagram illustrating the configuration of an exemplary self refresh pulse generation circuit in accordance with an embodiment of the present invention.

Referring to FIG. 3, the self refresh pulse generation circuit in accordance with the embodiment of the present invention includes a control signal generator 2 and a self refresh pulse generator 3. The control signal generator 2 is configured to generate a control signal whose level changes at an end time point of an initial period, after the self refresh pulse generation circuit enters a self refresh mode. The self refresh pulse generator 3 is configured to selectively output a first or second pulse PLS1 or PLS2 as a self refresh pulse PSRF in response to a control signal CON in the self refresh mode. The control signal generator 2 includes a control signal output unit 21 and an address counter 29.

Figure 4:
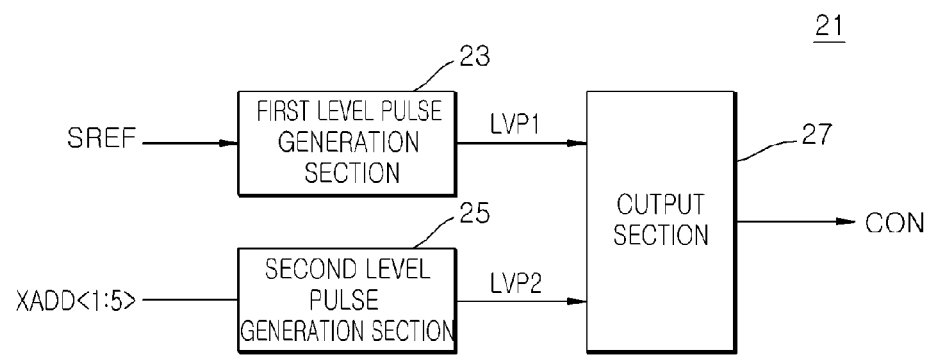
FIG. 4 is a circuit diagram of an exemplary control signal output unit included in the self refresh pulse generation circuit illustrated in FIG. 3.

Referring to FIG. 4, the control signal output unit 21 includes a first level pulse generation section 23, a second level pulse generation section 25, and an output section 27.

The first level pulse generation section 23 is configured to generate a first level pulse LVP1 at a time point where a self refresh signal SREF is enabled to a logic high level.

The second level pulse generation section 25 is configured to generate a second level pulse LVP2 at a time point where all bits of a row address XADD<1:5> are counted.

Figure 5:
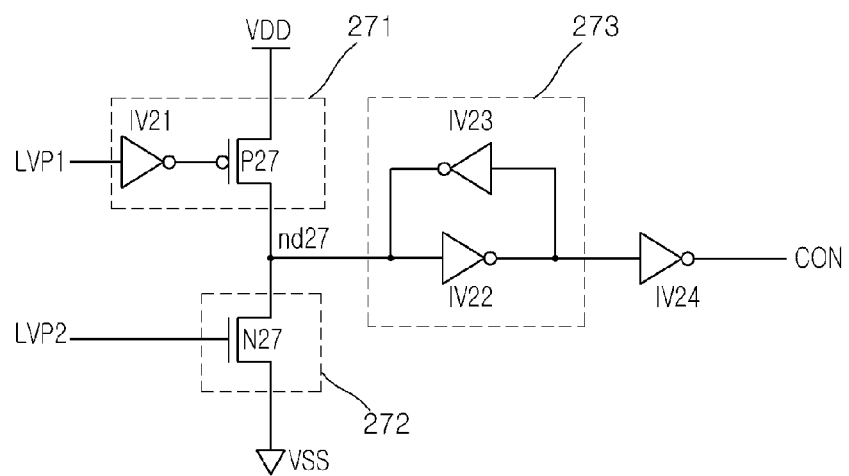
FIG. 5 is a circuit diagram of an exemplary output section included in the control signal output unit of FIG. 4.

Referring to FIG. 5, the output section 27 includes a pull-up driver 271, a pull-down driver 272, a latch 273, and a buffer IV24. The pull-up driver 271 is configured to pull-up drive a node nd27 in response to the first level pulse LVP1. The pull-down driver 272 is configured to pull-down drive the node nd27 in response to the second level pulse LVP2. The latch 273 is configured to latch a signal at the node nd27. The buffer IV24 is configured to invert and buffer an output signal of the latch 273. The output section 27 configured in such a manner drives and outputs the control signal CON in response to the first and second level pulses LVP1 and LVP2. That is, the output section 27 changes the control signal CON to a logic high level in response to the first level pulse LVP1 at a logic high level and the second level pulse LVP2 at a logic low level, and changes the control signal CON to a logic low level in response to the second level pulse LVP2 at a logic high level and the first level pulse LVP1 at a logic low level.

The address counter 29 in FIG. 3 includes a general counter, and is configured to count the row address XADD<1:5> in response to the self refresh pulse PSRF. Here, the row address XADD<1:5> may have an initial value set to "00000." In the following descriptions, it is assumed that the initial value of the row address XADD<1:5> is set to "00000." The address counter 29 sequentially counts the row address XADD<1:5> in response to the self refresh pulse PSRF until it counts to a final value "11111." Then, the address counter 29 counts the row address XADD<1:5> again with the initial value "00000." The initial period refers to a period from a time point where the self refresh pulse generation circuit enters the self refresh mode to a time point where all bits of the row address are counted. In other words, the initial period refers to a period from a time point where the self refresh signal SREF is enabled to a logic high level to a time point where the row address XADD<1:5> is sequentially counted from the initial value "00000" to the final value "11111."

The control signal generator 2 (FIG. 3) configured in such a manner changes the control signal CON to a logic high level in response to the first level pulse LVP1 generated at the time point where the self refresh signal SREF is enabled to a logic high level. Furthermore, the control signal generator 2 changes the control signal CON to a logic low level in response to the second level pulse LVP2 generated at the time point where the row address XADD<1:5> is sequentially counted from the initial value "00000" to the final value "11111," that is, the time point where all bits of the row address XADD<1:5> have been counted.

The self refresh pulse generator 3 includes a pulse generation unit 31 and a self refresh pulse output unit 33.

The pulse generation unit 31 is configured to generate the first and second pulses PLS1 and PLS2 in response to the self refresh signal SREF. Here, the self refresh signal SREF is enabled to a logic high level when the self refresh pulse generation circuit enters the self refresh mode. The period of the first pulse PLS1 may be set to be shorter than that of the second pulse PLS2.

Figure 6:
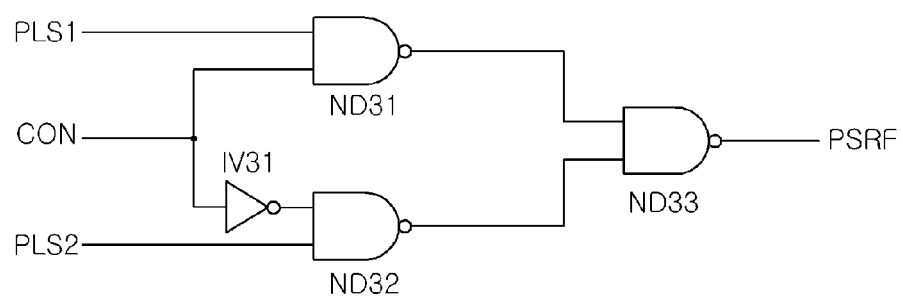
FIG. 6 is a circuit diagram of an exemplary self refresh pulse output unit included in the self refresh pulse generation circuit illustrated in FIG. 3.

Referring to FIG. 6, the self refresh pulse output unit 33 includes three NAND gates ND31 to ND33 and one inverter IV31. The self refresh pulse output unit 33 is configured to buffer the first pulse PLS1 to output as the self refresh pulse PSRF when the control signal CON is at a logic high level, and buffer the second pulse PLS2 to output as the self refresh pulse PSRF when the control signal CON is at a logic low level.

The self refresh pulse generator 3 configured in such a manner selectively outputs the first or second pulse PLS2 as the self refresh pulse PSRF in response to the control signal CON, in the self refresh mode.

The operation of the self refresh pulse generation circuit configured in the above-described manner, based on the five-bit row address XADD<1:5>, will be described with reference to FIG. 7.

At a time point T1 where the self refresh signal SREF is enabled to a logic high level, the control signal generator 2 changes the control signal CON to a logic high level. More specifically, referring to FIGS. 4 and 5, the first level pulse generation section 23 generates the first level pulse LVP1 in response to the high-level self refresh signal SREF. The output section 27 changes the control signal CON to a logic high level in response to the first level pulse LVP1. The self refresh pulse generator 3 outputs the first pulse PLS1 having a first period (a) as the self refresh pulse PSRF in response to the high-level control signal CON. The word lines are sequentially activated from the first word line WL<1> in response to the self refresh pulse PSRF, and a self refresh operation is performed on cells coupled to the activated word lines.

Then, at a time point T2 where all bits of the row address XADD<1:5> are counted, the control signal generator 2 changes the control signal CON to a logic low level. More specifically, referring to FIGS. 4 and 5, the second level pulse generation section 25 generates the second level pulse LVP2 in response to the row address XADD<1:5> at the time point T2 where the row address XADD<1:5> has been sequentially counted from the initial value "00000" to the final value "11111." The output section 27 changes the control signal CON to a logic low level in response to the second level pulse LVP2. The self refresh pulse generator 3 outputs the second pulse PLS2 having a second period (b) as the self refresh pulse PSRF in response to the low-level control signal CON. The word lines are sequentially activated from the first word line WL<1> in response to the self refresh pulse PSRF until the self refresh signal SREF is disabled, and cells coupled to the activated word lines are self-refreshed. The first period (a) is shorter than the second period (b).

From a time point T3 where the self refresh signal SREF is disabled to a logic low level, the first and second pulses PLS1 and PLS2 are not generated. Therefore, the self refresh pulse PSRF is not outputted.

In short, the self refresh pulse generation circuit in accordance with an embodiment of the present invention generates the self refresh pulse PSRF having a short cycle during the initial period after entering the self refresh mode, thereby preventing a refresh fail.

The embodiments of the present invention have been disclosed above for illustrative purposes. Those skilled in the art will appreciate that various modifications, additions, and substitutions are possible, without departing from the scope and spirit of the invention as disclosed in the accompanying claims.

What is claimed is:

1. A self refresh pulse generation circuit comprising:
a control signal generator configured to generate a control signal asserted for an initial period of a self refresh mode; and
a self refresh pulse generator configured to generate a self refresh pulse having a period controlled in response to the control signal, in the self refresh mode,
wherein the initial period is from the beginning of the self refresh mode to when a count of a row address is at its maximum value.

2. The self refresh pulse generation circuit of claim 1, wherein the control signal generator comprises:
- an address counter configured to count the row address in response to the self refresh pulse; and
- a control signal output unit configured to output the control signal in response to a self refresh signal and the row address.

3. The self refresh pulse generation circuit of claim 2, wherein the address counter increments the row address by one whenever the self refresh pulse is generated.

4. The self refresh pulse generation circuit of claim 2, wherein the control signal output unit comprises:
- a first level pulse generation section configured to generate a first level pulse in response to the self refresh signal;
- a second level pulse generation section configured to generate a second level pulse in response to the row address; and
- an output section configured to drive and output the control signal in response to one of the first and second level pulses.

5. The self refresh pulse generation circuit of claim 4, wherein the output section comprises:
- a pull-up driver configured to pull-up drive a node in response to the first level pulse;
- a pull-down driver configured to pull-down drive the node in response to the second level pulse; and
- a latch configured to latch a signal at the node.

6. The self refresh pulse generation circuit of claim 5, further comprising a buffer to buffer an output signal of the latch.

7. The self refresh pulse generation circuit of claim 1, wherein the self refresh pulse generator comprises:
- a pulse generation unit configured to generate first and second pulses in response to a self refresh signal; and
- a self refresh pulse output unit configured to selectively output the first or second pulse as a self refresh pulse in response to the control signal.

8. The self refresh pulse generation circuit of claim 7, wherein the first pulse has a shorter period than the second pulse.

9. The self refresh pulse generation circuit of claim 7, wherein the first pulse is selectively output when the control signal is asserted.

10. A self refresh pulse generation circuit comprising:
- a pulse generation unit configured to generate first and second pulses in response to a self refresh signal; and
- a self refresh pulse output unit configured to selectively output the first or second pulse as a self refresh pulse in response to a control signal asserted for an initial period of a self refresh mode.

11. The self refresh pulse generation circuit of claim 10, wherein the first pulse has a shorter period than the second pulse.

12. The self refresh pulse generation circuit of claim 10, wherein the first pulse is selectively output when the control signal is asserted.

13. The self refresh pulse generation circuit of claim 10, wherein the initial period ranges from a beginning of the self refresh mode to when a count of a row address is at its maximum value.

14. The self refresh pulse generation circuit of claim 10, further comprising a control signal generator configured to generate the control signal.

15. The self refresh pulse generation circuit of claim 14, wherein the control signal generator comprises:
- an address counter configured to count a row address in response to the self refresh pulse; and
- a control signal output unit configured to output the control signal in response to a self refresh signal and the row address.

16. The self refresh pulse generation circuit of claim 15, wherein the address counter increments the row address by one whenever the self refresh pulse is generated.

17. The self refresh pulse generation circuit of claim 15, wherein the control signal output unit comprises:
- a first level pulse generation section configured to generate a first level pulse in response to the self refresh signal;
- a second level pulse generation section configured to generate a second level pulse in response to the row address; and
- an output section configured to drive and output the control signal in response to the first and second level pulses.

18. The self refresh pulse generation circuit of claim 17, wherein the output section comprises:
- a pull-up driver configured to pull-up drive a node in response to the first level pulse;
- a pull-down driver configured to pull-down drive the node in response to the second level pulse; and
- a latch configured to latch a signal of the node.

19. The self refresh pulse generation circuit of claim 18, further comprising a buffer to buffer an output signal of the latch.

20. A method of refreshing memory, comprising:
- selectively outputting a series of first pulses with a first period as a self refresh pulse signal for an initial period of a refresh cycle; and
- selectively outputting a series of second pulses with a second period as the self refresh pulse signal for a remainder of the refresh cycle after the initial period, wherein the initial period is the amount of time to count all row addresses by a counter that is clocked by the self refresh pulse signal.

* * * * *